US007501924B2

(12) United States Patent
Zhang

(10) Patent No.: US 7,501,924 B2
(45) Date of Patent: Mar. 10, 2009

(54) SELF-SHIELDING INDUCTOR

(75) Inventor: Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 399 days.

(21) Appl. No.: 11/239,933

(22) Filed: Sep. 30, 2005

(65) Prior Publication Data

US 2007/0075813 A1 Apr. 5, 2007

(51) Int. Cl.
*H01F 5/00* (2006.01)
*H01L 23/552* (2006.01)

(52) U.S. Cl. ........................ 336/200; 336/223; 336/232; 257/659

(58) Field of Classification Search ................. 336/200, 336/223, 232; 257/686, 659–660
See application file for complete search history.

(56) References Cited

U.S. PATENT DOCUMENTS 5,027,185 A 6/1991 Liauh
5,083,236 A 1/1992 Chason et al.
5,373,112 A * 12/1994 Kamimura et al. .......... 174/255
5,446,311 A 8/1995 Ewen et al.
5,459,368 A 10/1995 Onishi et al.
5,461,353 A 10/1995 Eberhardt
5,559,360 A 9/1996 Chiu et al.
5,760,456 A 6/1998 Grzegorek et al.
5,793,272 A 8/1998 Burghartz et al.
5,884,990 A * 3/1999 Burghartz et al. ........... 336/200
5,918,121 A 6/1999 Wen et al.
5,959,515 A 9/1999 Cornett et al.
5,959,522 A 9/1999 Andrews
6,008,102 A 12/1999 Alford et al.
6,037,649 A 3/2000 Liou
6,046,109 A 4/2000 Liao et al.
6,054,329 A 4/2000 Burghartz et al.
6,114,937 A 9/2000 Burghartz et al.
6,124,624 A 9/2000 Van Roosmalen et al.
6,146,958 A 11/2000 Zhao et al.
6,153,489 A 11/2000 Park et al.

(Continued)

FOREIGN PATENT DOCUMENTS

EP 0 675 539 A2 10/1995

(Continued)

OTHER PUBLICATIONS

Frommberger, Michael, et al., "Integration of Crossed Anisotropy Magnetic Core Into Toroidal Thin-Film Inductors," IEEE Transactions on Microwave Theory and Techniques, vol. 53, No. 6, Jun. 2005, pp. 2096-2100.

(Continued)

*Primary Examiner*—Anh T Mai
(74) *Attorney, Agent, or Firm*—Zagorin O'Brien Graham LLP

(57) ABSTRACT

An oscillator circuit formed at least partially on an integrated circuit substrate includes a self-shielding inductor. The self-shielding inductor has a toroidal structure. A coil forms a structure that is symmetric around an axis orthogonal to a surface of the integrated circuit substrate. A magnetic filed generated by the self-shielding inductor is confined to a core region of the coil. Portions of the self-shielding inductor may be formed in integrated circuit layers, redistribution layers, package layers, through-substrate interconnect, backside substrate conductor layers, or combinations thereof.

26 Claims, 12 Drawing Sheets

U.S. PATENT DOCUMENTS

| | | | |
|---|---|---|---|
| 6,169,008 B1 | 1/2001 | Wen et al. | |
| 6,218,729 B1 | 4/2001 | Zavrel, Jr. et al. | |
| 6,362,525 B1 | 3/2002 | Rahim | |
| 6,373,369 B2 | 4/2002 | Huang et al. | |
| 6,389,691 B1 | 5/2002 | Rinne et al. | |
| 6,486,534 B1 | 11/2002 | Sridharan et al. | |
| 6,501,169 B1 | 12/2002 | Aoki et al. | |
| 6,534,843 B2 | 3/2003 | Acosta et al. | |
| 6,600,208 B2 | 7/2003 | Brennan et al. | |
| 6,653,557 B2 | 11/2003 | Wolf et al. | |
| 6,790,759 B1 | 9/2004 | Wang et al. | |
| 6,847,282 B2 | 1/2005 | Gomez et al. | |
| 6,873,065 B2 | 3/2005 | Haigh et al. | |
| 6,900,087 B2 | 5/2005 | Lowther et al. | |
| 2002/0109204 A1 | 8/2002 | Acosta et al. | |
| 2002/0140081 A1 | 10/2002 | Chou et al. | |
| 2004/0140862 A1 | 7/2004 | Brown et al. | |
| 2004/0178472 A1 | 9/2004 | Zhang et al. | |
| 2004/0222478 A1 | 11/2004 | Zhang et al. | |
| 2004/0222506 A1 | 11/2004 | Wei et al. | |
| 2004/0222511 A1 | 11/2004 | Zhang | |
| 2004/0257166 A1* | 12/2004 | Wang | 331/167 |
| 2005/0285683 A1* | 12/2005 | Drost et al. | 330/302 |

FOREIGN PATENT DOCUMENTS

| | | |
|---|---|---|
| WO | WO 02/067326 A2 | 8/2002 |

OTHER PUBLICATIONS

Kim, Sung-Jin, et al., "Realization of High-Q Inductors Using Wirebonding Technology," School of Electronics Engineering, Ajou University, AP-ASIG Proceedings, Aug. 1999, 4 pages.

Long, John R. and Miles A. Copeland, "The Modeling, Characterization, and Design of Monolithic Inductors for Silicon RF IC's," IEEE Journal of Solid-State Circuits, vol. 32, No. 3, Mar. 1997, pp. 357-369.

Soh, H. T., et al., "Through-Wafer Vias (TWV) and their Applications in 3 Dimensional Structures," Proceedings of 1998 International Conference on Solid State Devices and Materials, Sep. 1998, 12 pages.

Tang, Chih-Chun, et al., "Miniature 3-D Inductors in Standard CMOS Process," IEEE Journal of Solid-State Circuits, vol. 37, No. 4, Apr. 2002, pp. 471-480.

Treleaven, Dave and Dick James, "Integrated Circuit Passive Components," Whitepapers, Chipworks, www.chipworks.com/resources/resources_whitepapers.asp, 4 pages.

Tsui, Hau-Yiu and Jack Lau, 2003 IEEE MTT-S Digest, pp. 225-228.

"Unitive—CSP On the Edge", Unitive Inc. 2003 (from website—http://unitive.com/cspedge/index.cfm), 2 pages.

"Unitive Design Guidelines", www.unitive.com, 2001, pp. 1-18.

Wu, Joyce H., et al., "A Through-Wafer Interconnect in Silicon for RFICs," IEEE Transactions on Electron Devices, vol. 51, No. 11, Nov. 2004, pp. 1765-1771.

Zannoth, Markus, et al., "A Fully Integrated VCO at 2 GHz," IEEE Journal of Solid-State Circuits, vol. 33, No. 12, Dec. 1998, pp. 1987-1991.

Zou, Jun, et al., Development of Vertical Planar Coil Inductors Using Plastic Deformation Magnetic Assembly (PDMA), 2001 IEEE International Microwave Symposium, May 2001, 4 pages.

Chang, J.Y.-C. et al., "Large Suspended Inductors on Silicon and Their Use in a 2-μm CMOS RF Amplifier," IEEE Electron Device Letters, vol. 14, No. 5, May 1993, pp. 246-248.

Larson, Lawrence and Jessie, Darryl, "Advances in RF Packaging Technologies for Next-Generation Wireless Communications Applications (Invited Paper)," in Proceedings of the Custom Integrated Circuits Conference, IEEE, 8 pages, Sep. 21-24, 2003.

Solberg, Vern, "Innovative 3-D Solutions for Multiple-Die IC Packaging," Medical Device Link, 4 pages, retrieved Feb. 16, 2006 from URL: http://www.devicelink.com/grabber.php3?URL=http://www.devicelink.com/mem/archive/05/04/002.html, originally published MEM Spring 2005.

* cited by examiner

SELF-SHIELDING INDUCTOR

BACKGROUND

1. Field of the Invention

The present invention relates to integrated circuits, and more particularly to such integrated circuits incorporating shielded inductor structures.

2. Description of the Related Art

Many modern integrated circuit devices, e.g., stable oscillators, require a high-Q (i.e., quality factor) inductor that is immune to external noise sources to achieve desired specifications. Crystal oscillators may be employed, but typically require an off-chip crystal mounted elsewhere on a printed-wiring-board. LC oscillators offer the potential advantage of being able to incorporate such an oscillator on-chip.

To achieve a suitable oscillator for certain applications (e.g, inclusion in a narrow bandwidth phase-locked loop (PLL)), a high-Q (i.e., quality factor) LC oscillator is typically required. For example, a Q>20 may be required for certain applications. It is difficult to achieve such a high-Q with conventional on-chip inductors using conductor and dielectric layer compositions and thicknesses which are typically encountered in traditional integrated circuit processes. In addition, such inductors are susceptible to electromagnetic interference from external sources of noise. For certain applications using LC oscillators, a low bandwidth PLL is desirable to ensure that jitter from a noisy source is not passed to the output. In contrast, high bandwidth PLLs tend to pass input jitter to the output. However, the ability of a PLL to resist the pulling from external noise sources is directly proportional to the loop bandwidth. Inductors inside of the PLL, particularly inside an LC oscillator included in the PLL, are most prone to pulling. Accordingly, it is desirable to shield the inductor from external noise sources, particularly in low bandwidth applications to reduce the possible degradation in performance. Therefore, improvements to high-Q LC oscillators are desired to achieve stable oscillators, particularly for use as low-jitter clock sources.

SUMMARY

An oscillator circuit formed at least partially on an integrated circuit substrate includes a self-shielding inductor. The self-shielding inductor has a toroidal structure. A coil forms a structure that is symmetric around an axis orthogonal to a surface of the integrated circuit substrate. A magnetic field generated by the self-shielding inductor is confined to a core region of the coil. Portions of the self-shielding inductor may be formed in integrated circuit layers, redistribution layers, package layers, through-substrate interconnect, backside substrate conductor layers, or combinations thereof.

In at least one embodiment of the invention, an apparatus includes a self-shielding inductor forming at least a portion of an oscillator circuit. The self-shielding inductor includes a coil of coupled conductor portions. The coil is formed around an axis and the coupled conductor portions substantially enclose a core region within the coil. The axis is coplanar with cross-sections of the coil and is external to cross-sections of the coil. The coupled conductor portions may be formed from integrated circuit layers having thicknesses less than 3 μm thick. The self-shielding inductor may be formed on an integrated circuit and the coil may have rectangular cross-sections and at least one of the length and width of an individual cross-section may be in a range from approximately 9 μm to approximately 200 μm, inclusively. The self-shielding inductor may be formed at least partially in a redistribution layer.

The coil of the self-shielding inductor may have rectangular cross-sections. At least one of the length and width of an individual cross-section may be in a range from approximately 20 μm to approximately 100 μm, inclusively. The self-shielding inductor may be formed at least partially in a package enclosing an integrated circuit. At least one of the length and width of an individual cross-section may be in a range from approximately 20 μm to approximately 200 μm, inclusively. A length of the coil may be in a range from approximately 100 μm to approximately 700 μm, inclusively. The self-shielding inductor may have an inductance of less than approximately 1 nH. The self-shielding inductor may have an inductance in a range of approximately 0.9 pH to approximately 275 pH, inclusively. The self-shielding inductor may have an associated quality factor in a range of approximately 8 to approximately 130 at approximately 5 GHz or greater, inclusively. The self-shielding inductor may have an inductance in a range of approximately 0.9 pH to approximately 9 pH, inclusively. The self-shielding inductor may have an associated quality factor in a range from approximately 8 to approximately 57, inclusively, at approximately 10 GHz or greater. A maximum of approximately 3 μm of dielectric material may separate adjacent turns of the coil.

In at least one embodiment of the invention, an apparatus includes an oscillator circuit having a self-shielding inductor. The self-shielding inductor is configured to generate a magnetic field in response to a current flowing through coupled conductor portions. The magnetic field generated is confined to a core region of the self-shielding inductor. The oscillator circuit may include a capacitance coupled in parallel with the self-shielding inductor. The capacitance may be formed to provide a current path having a current distribution effectively the same as coupled conductor portions of the self-shielding inductor. The oscillator circuit may include an amplifier coupled in parallel with the self-shielding inductor. The amplifier may be formed to provide a current path having a current distribution effectively the same as coupled conductor portions of the self-shielding inductor.

In at least one embodiment of the invention, a method includes generating a magnetic field by rotating current through coupled conductor portions of an inductor that couples a first node to a second node. The coupled conductor portions form a coil that substantially encloses a core region. The magnetic field is substantially confined to the core region of the inductor. The method includes capacitively coupling the first and second nodes. The method includes amplifying a signal between the first and second nodes. A length of the coil of the self-shielding inductor may be in a range from approximately 100 μm to approximately 1000 μm, inclusively. The coupled conductor portions may be formed from integrated circuit layers having thicknesses less than 3 μm thick. The self-shielding inductor may be formed on an integrated circuit. At least one of a length and a width of an individual cross-section of a coil of the self-shielding inductor may be in a range from approximately 9 μm to approximately 250 μm, inclusively. The self-shielding inductor may be formed at least partially on the backside of an integrated circuit substrate. The self-shielding inductor may be formed at least partially in a redistribution layer. At least one of a length and a width of an individual cross-section of a coil of the self-shielding inductor may be in a range from approximately 20 μm to approximately 100 μm, inclusively. The self-shielding inductor may be formed at least partially in a package enclosing an integrated circuit. A coil of the self-shielding inductor may have rectangular cross-sections having at least one of a length and a width of an individual cross-section in a range from approximately 20 μm to approximately 200 μm, inclusively. A length of the coil of the self-shielding inductor may be in a range from approximately 100 μm to approximately 1000 μm, inclusively. The self-shielding inductor may have an inductance of less than approximately 1 nH. The self-shielding inductor may have an inductance in a range of approximately 0.9 pH to approximately 275 pH, inclusively. The self-shielding inductor may have an inductance in a range of approximately 0.9 pH to approximately 9 pH, inclusively. A number of turns forming a coil of the self-shielding inductor may be in a range from one turn to approximately twenty turns, inclusively. Less than approximately one complete turn may form a coil of the self-shielding inductor. The oscillator circuit may include a capacitance coupled in parallel with the self-shielding inductor. The capacitance may being formed to provide a current path having a current distribution effectively the same as coupled conductor portions of the self-shielding inductor. The oscillator circuit may include an amplifier coupled in parallel with the self-shielding inductor. The amplifier may be formed to provide a current path having a current distribution effectively the same as coupled conductor portions of the self-shielding inductor.

In at least one embodiment of the invention, a method of manufacturing an integrated circuit product includes forming an amplifier on an integrated circuit. The method includes forming a capacitor coupled to the amplifier. The method includes forming a self-shielding inductor coupled to the amplifier. The self-shielding inductor includes a coil of coupled conductor portions. The coil is formed around an axis and the coupled conductor portions substantially enclose a core region within the coil. The axis is coplanar with cross-sections of the coil and is external to cross-sections of the coil. The self-shielding inductor, the amplifier, and the capacitor form at least a portion of an oscillator circuit. Forming the self-shielding inductor may include forming the coupled conductor portions from integrated circuit layers having thicknesses less than 3 μm thick. The method may include forming the self-shielding inductor on an integrated circuit, at least one of a length and a width of an individual cross-section of a coil of the self-shielding inductor being in a range from approximately 9 μm to approximately 200 μm, inclusively. Forming the self-shielding inductor may include forming the self-shielding inductor at least partially on the backside of an integrated circuit substrate. Forming the self-shielding inductor may include forming the self-shielding inductor at least partially in a redistribution layer and at least one of a length and a width of an individual cross-section of a coil of the self-shielding inductor may be in a range from approximately 20 μm to approximately 100 μm, inclusively. Forming the self-shielding inductor may include forming the self-shielding inductor at least partially in a package enclosing an integrated circuit and a coil of the self-shielding inductor may have rectangular cross-sections having at least one of a length and a width of an individual cross-section in a range from approximately 20 μm to approximately 200 μm, inclusively. A length of the coil of the self-shielding inductor may be in a range from approximately 100 μm to approximately 1000 μm, inclusively. The self-shielding inductor may have an inductance of less than approximately 1 nH. The self-shielding inductor may have an inductance in a range of approximately 0.9 pH to approximately 275 pH, inclusively. The self-shielding inductor may have an inductance in a range of approximately 0.9 pH to approximately 9 pH, inclusively. A number of turns of the coil of the self-shielding inductor may be in a range from one turn to approximately twenty turns, inclusively. Less than approximately one complete turn may form a coil of the self-shielding inductor. Forming the capacitor may include forming a current path having a current distribution effectively the same as coupled conductor portions of the self-shielding inductor. Forming the amplifier may include forming a current path having a current distribution effectively the same as coupled conductor portions of the self-shielding inductor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
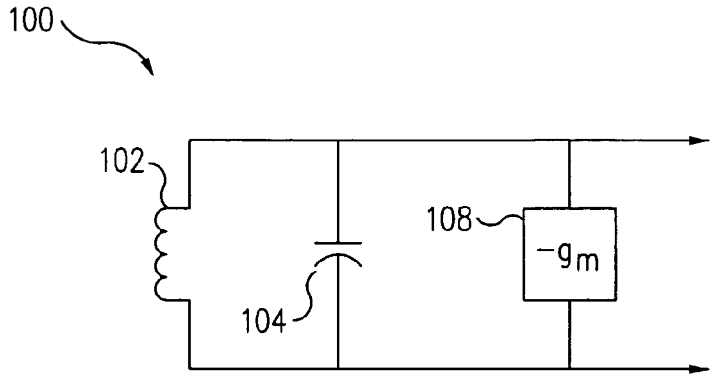
FIG. 1 illustrates a schematic/block diagram of an exemplary LC oscillator circuit consistent with at least one embodiment of the present invention.

Referring to FIG. 1, an integrated circuit die includes an LC oscillator circuit e.g., circuit 100, including inductor 102, capacitor 104, and gain stage 108. The quality factor associated with the resonant circuit (i.e., $Q_{RESONANT}$) describes the ability of the circuit to produce a large output at a resonant frequency and also describes the selectivity of the circuit. The $Q_{RESONANT}$ may be substantially affected by the quality factor of an inductor (i.e., $Q_L$) included in the resonant circuit. In general, $Q_L$ for an inductor modeled as an inductance in series with a resistance is $$Q_L = \frac{\omega L}{R}$$

where ω is the angular frequency of oscillation, L is the inductance of the inductor, and R is the effective series resistance of the inductor.

In general, an inductor includes an input, an output, and a coil disposed therebetween through which current rotates. The coil introduces inductance into an electrical circuit, to produce magnetic flux. As referred to herein, a coil is a conductor having at least a fractional number of turns around a core region of space. An individual turn of an exemplary coil may be defined by a curve traced by the tip of a position vector, e.g, R(t)=x(t)i+y(t)j+z(t)k from t=a to t=b. As referred to herein, one full turn of the coil is defined by a portion of the curve as t runs from 0 to 2π. However, an exemplary coil may make any number of full turns or fractional turns. For example, less than one full turn, i.e., R(t) for $0<t<2\pi$, may form the coil. Small inductors with a good quality factor (Q) have been very difficult to design given modern integrated circuit design restrictions. Traditionally, inductors are designed to be metal traces forming planar loops (e.g., spiral inductors). One limitation on this type of inductor is that as the inductance value L decreases, its quality factor $Q_L$ tends to get smaller as well. This makes small inductors less useful in high-frequency, low-loss VCO designs.

Figure 2:
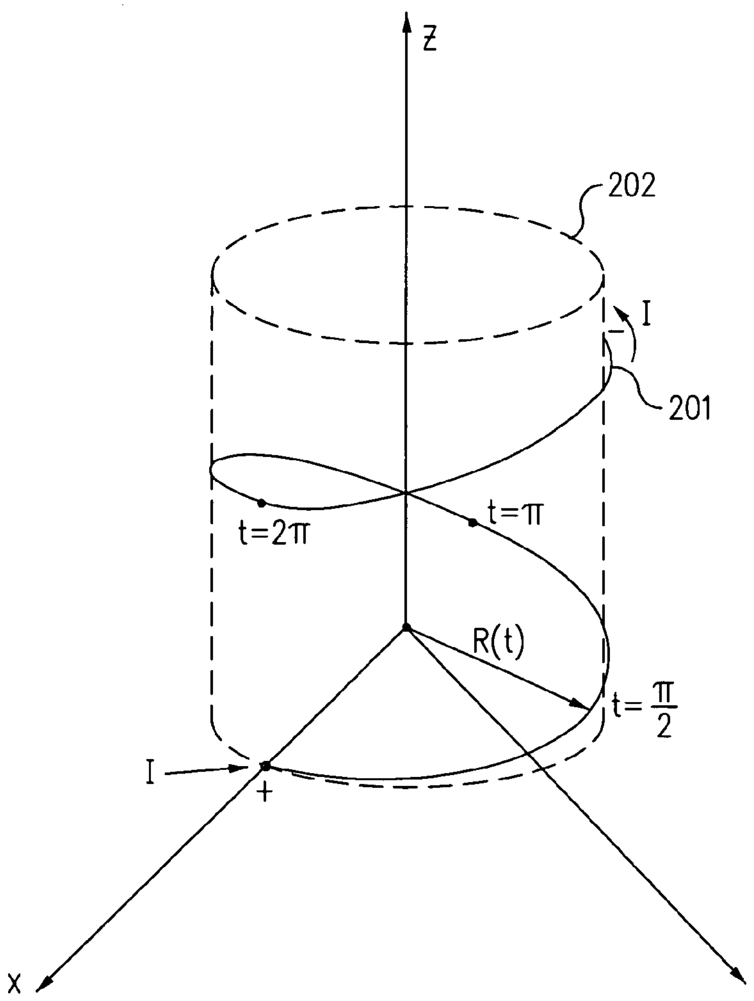
FIG. 2 illustrates a perspective view of a helical coil

Referring to FIG. 2, individual turns of a coil (e.g., coil 201) included in an inductor may be defined by the curve of a helix, i.e., R(t)=(cos t)i+(sin t)j+tk, formed around cylindrical core region (e.g., core region 202). The pitch of a helical coil is the length of one full helix turn, measured along the helix axis (e.g., the z-axis of coil 201). The coil may be right-handed (i.e., for a vertical coil, front strands of the coil move from the lower left to the upper right) or left-handed (i.e., for a vertical coil, front strands of the coil move from the lower right to the upper left). A coil formed in an integrated circuit manufacturing process may approximate an ideal helical coil by forming a polygonal-shaped core region (e.g., rectangular, square, octagonal, or other suitable shape) rather than a cylindrical-shaped core region. The axis of the helical coil is parallel to the front surface of an integrated circuit.

Figure 3:
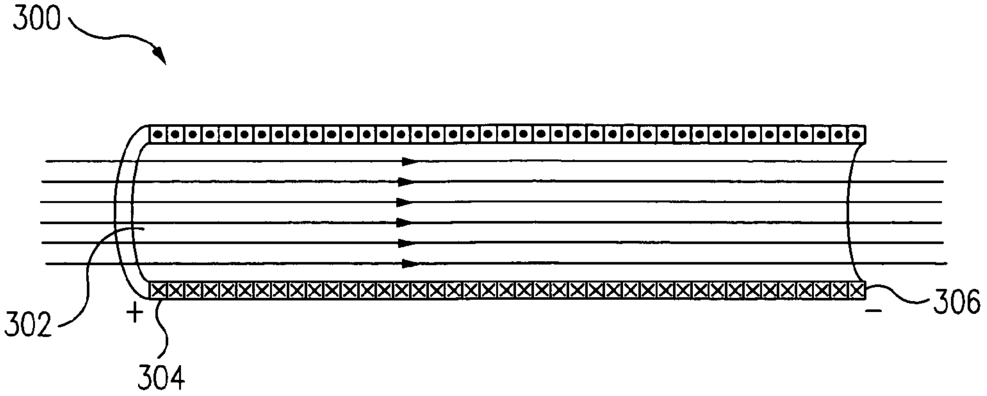
FIG. 3 illustrates a portion of an ideal, multi-turn solenoid.
Figure 4:
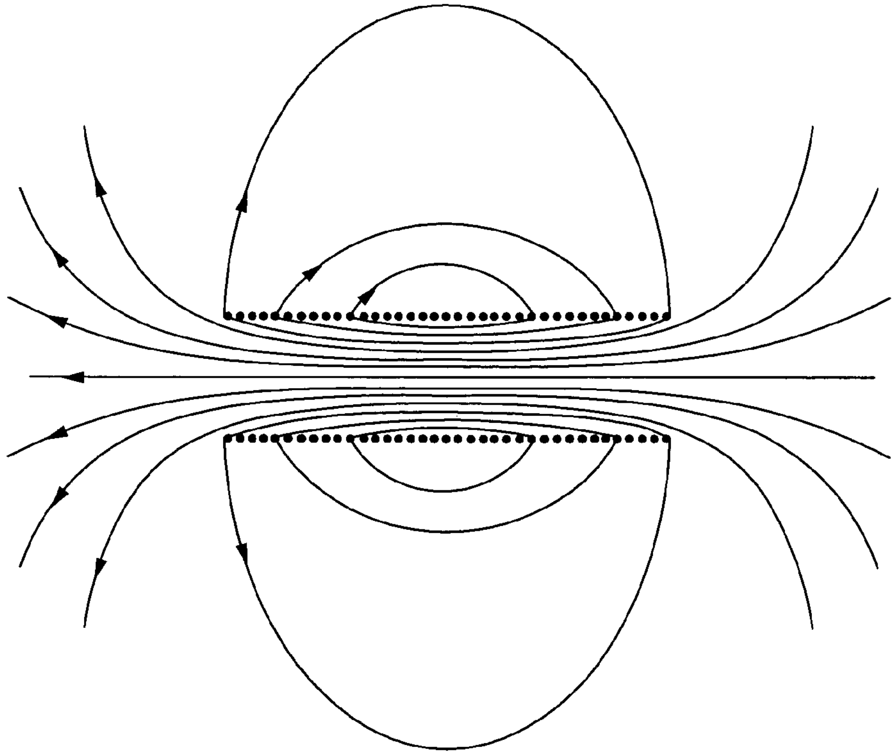
FIG. 4 illustrates magnetic field lines associated with a finite-length, multi-turn solenoid.

An ideal inductor may be a solenoid, i.e., a low pitch helical coil that has a length much greater than the diameter of the coil. The pitch of the helical coil is small enough that the solenoid is effectively a cylindrical current sheet. Magnetic fields established by current flowing through the individual turns radiate in concentric circles from the turns and cancel such that the magnetic field inside the solenoid (i.e., in the core of the coil) at points far enough from the wires are effectively parallel to the helical axis. For an infinitely long solenoid, the magnetic field outside the solenoid approaches zero. Referring to ideal solenoid portion 300 of FIG. 3, when a current flows from positive node 304 to negative node 306, the current rotates through the solenoid (i.e., the current flows into the turns on the lower portion of the solenoid and the current flows out of the upper portion of the solenoid) and a magnetic field is generated within core region 302. However, a solenoid of finite length will establish a magnetic field at points external to the core of the solenoid (FIG. 4). Such a magnetic field is less confined and more susceptible to electromagnetic interference, which may change the effective inductance of the inductor.

Figure 5:
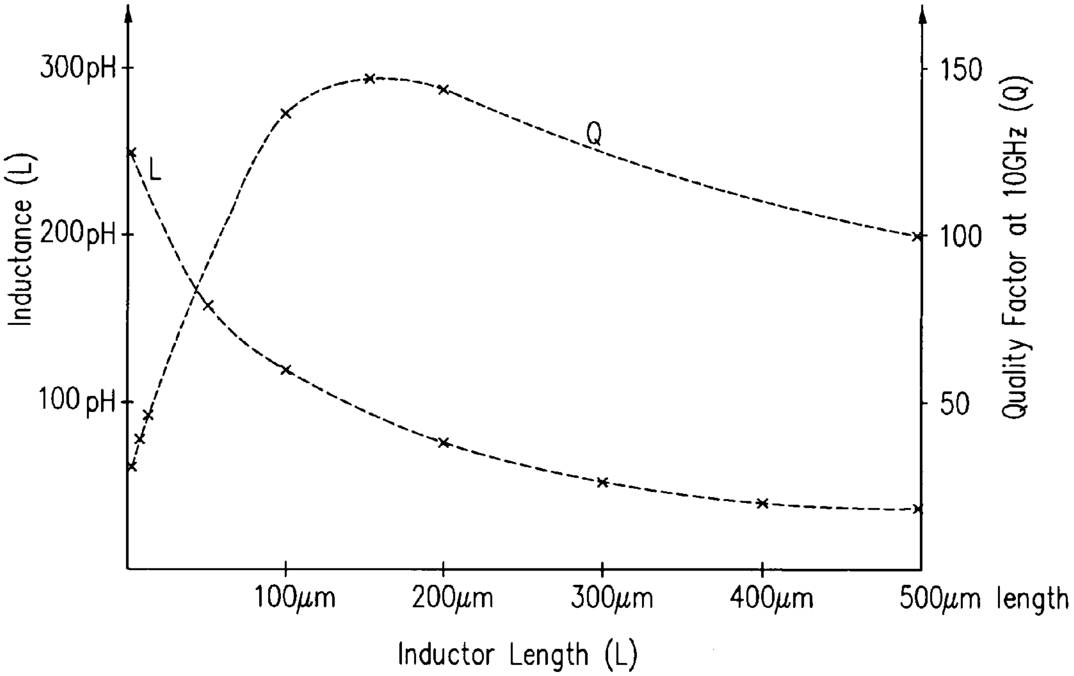
FIG. 5 illustrates a graphical representation of inductance and inductor Q as a function of inductor length for an approximately single turn, solenoidal inductor.

In an exemplary finite length solenoidal inductor (i.e., a coil formed around a polygonal-shaped core region to satisfy certain integrated circuit and semiconductor processing requirements rather than a cylindrical-shaped core region of an ideal solenoid) the coil turns are spaced close enough together so that leakage of magnetic flux from those gaps is negligible. However, because the coil is finite in length, the coil will have an external magnetic field that results in mutual inductance between the coil and external electromagnetic interference, which changes the realized inductance of a solenoidal inductor and degrades the quality of the solenoidal inductor. A cross-section of a core of an exemplary solenoidal inductor has a height of 200 μ and a width of 200 μ. Simulations of such a coil in a vacuum indicate that as the coil length increases (i.e., the length of the polygonal-shaped core region increases), the inductance decreases, but the associated $Q_L$ at 10 GHz is maintained at high levels (i.e., greater than 100) for lengths greater than 100 μm (FIG. 5). These results are approximately the same for a coil substantially surrounded by silicon dioxide, air, or other non-conducting dielectric material.

Figure 6:
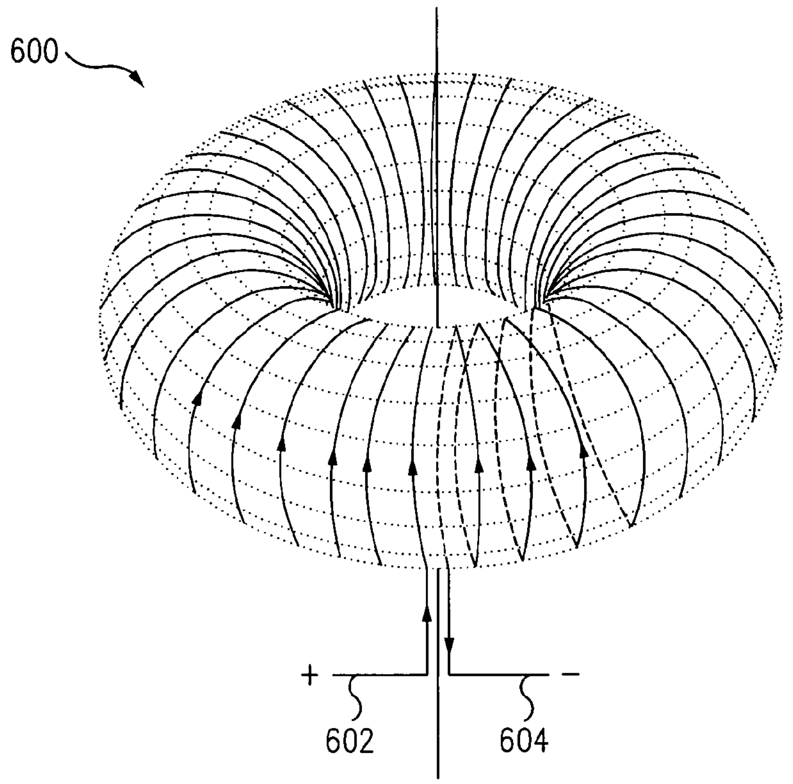
FIG. 6 illustrates a perspective view of an ideal, multi-turn toroid.
Figure 7:
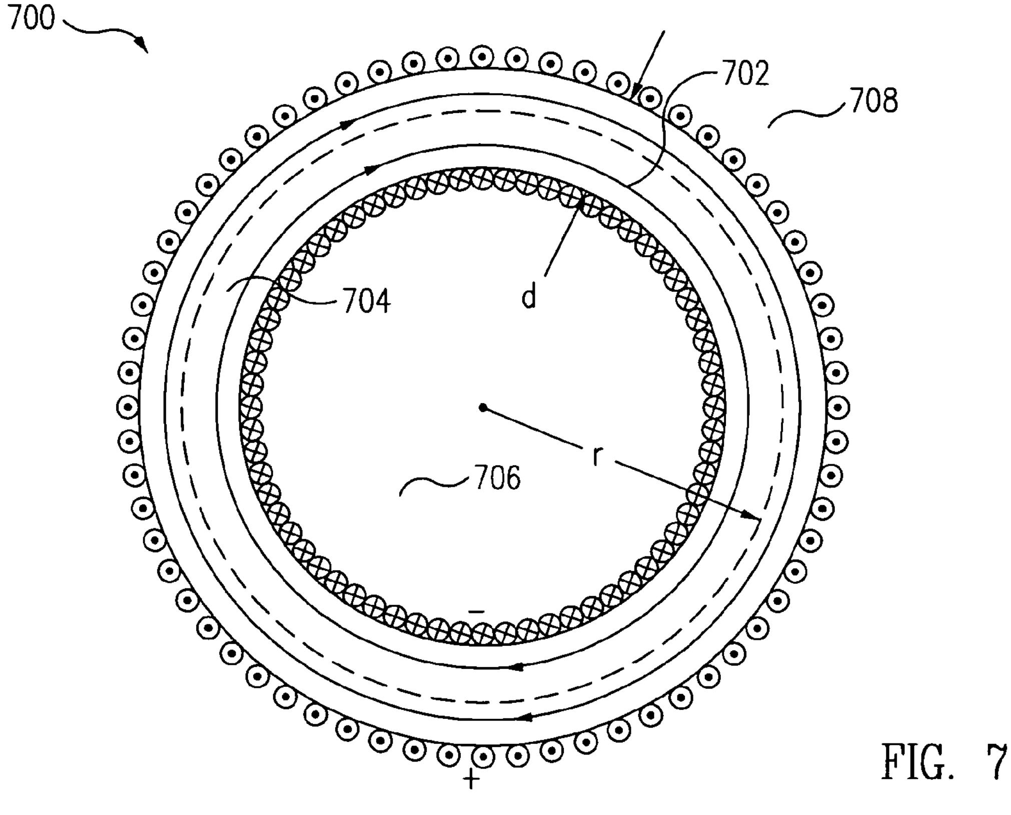
FIG. 7 illustrates a cross sectional view of an ideal toroid, the cross sectional plane being orthogonal to an axis of the ideal toroid.

A technique for reducing the external magnetic field that results in mutual inductance between the solenoidal inductor and external electromagnetic interference, confines the magnetic field generated by the solenoidal inductor by self-enclosing the solenoidal inductor to form a toroidal inductor. Referring to FIG. 6, an ideal toroidal surface has an annular shape, which may be generated by revolving a circle around an axis external to the circle. As referred to herein, an ideal toroidal inductor is a finite length solenoid formed substantially symmetrically around an axis external to the solenoid and orthogonal to cross-sections of the solenoid coil to close itself (e.g., the input terminal 602 and output terminal 604 of inductor 600 are substantially adjacent coil portions). Referring to FIG. 7, the magnetic field inside the coil of a toroidal inductor (i.e., the magnetic field in the core region of the toroidal inductor) follows concentric circles of a particular magnetic field (e.g., magnetic field line 702 in core region 704 of inductor 700). The magnetic field is effectively zero at points outside the coil of the toroidal inductor (i.e., in center region 706 and region 708).

Figure 8A:
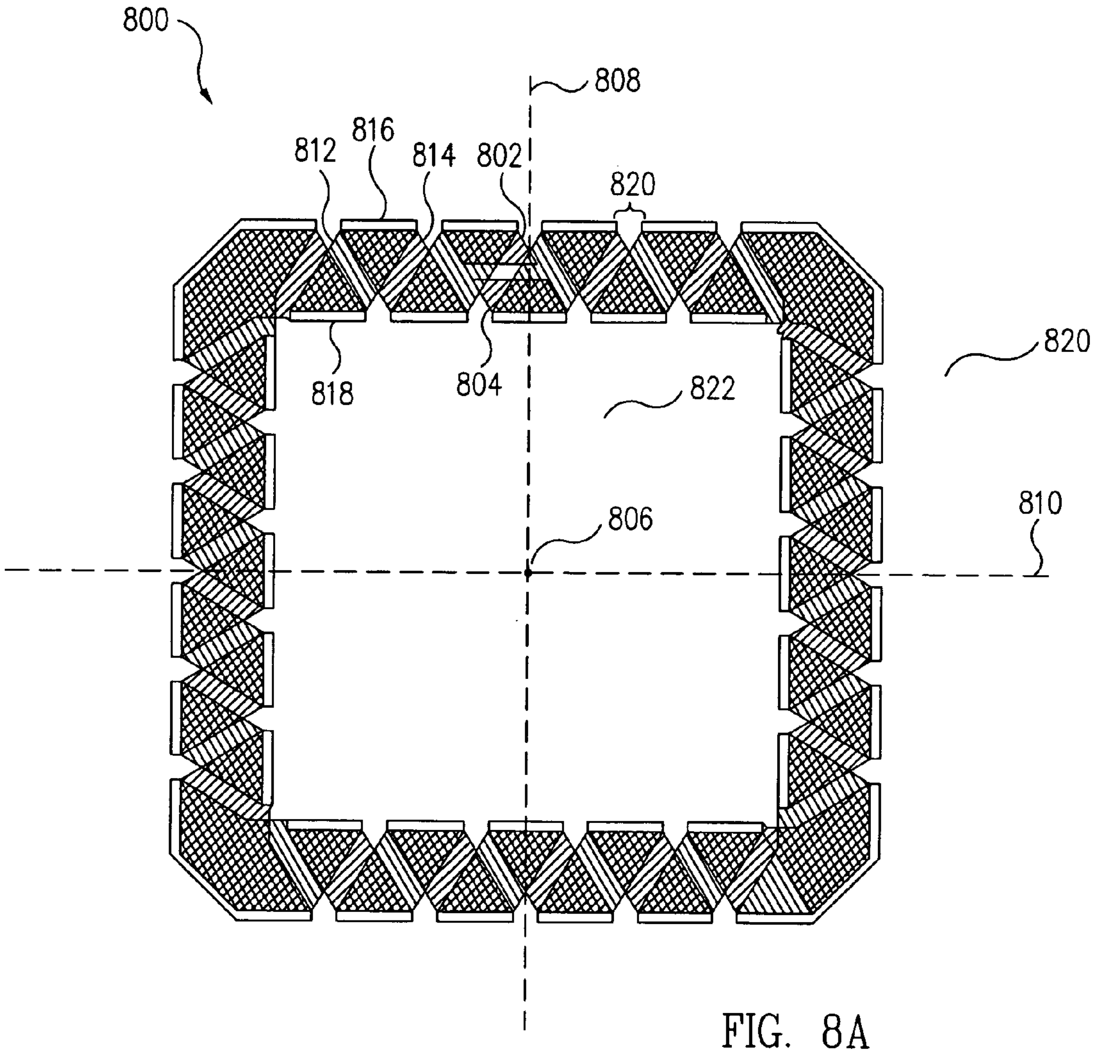
FIG. 8A illustrates a top-down, two-dimensional view of a twenty turn, self-shielding inductor consistent with at least one embodiment of the present invention.

Referring to FIG. 8A, actual toroidal inductors (e.g., inductor 800) may be realized in an exemplary integrated circuit manufacturing technology by approximating an ideal toroidal inductor by forming a coil around an axis (e.g., the axis orthogonal to the page and intersecting center point 806) symmetrically in at least two dimensions. For example, a coil may be formed in a polygonal shape (e.g., rectangular, square, octagonal, or other suitable shape) around an axis orthogonal to a surface of an integrated circuit. The coil approximates an ideal helical coil by having a polygonal cross-section (e.g., rectangular, square, octagonal, or other suitably shaped cross-section), rather than a circular cross-section. Inductor 800 is symmetric about plane 808 and plane 810, i.e., magnetic fields external to inductor 800 (i.e., magnetic fields in center region 822 and region 820) and generated by current through inductor 800 (e.g., a current flowing into positive terminal 802 and out of negative terminal 804, the current flow being counter-clockwise around the axis orthogonal to the page and intersecting center point 806) have substantially equal and opposite components. Respective equal and opposite components effectively cancel magnetic fields generated external to the coil by such components.

In a particular application, a typical inductor may be shielded to achieve satisfactory performance at high frequencies. At high frequencies, a non-ideal toroidal inductor (e.g., a toroidal inductor forming a rectangle centered about an axis and formed from a helical coil having angular turns) may be satisfactory for the particular application because conductor portions forming the coil are thicker than the skin depth of the material for particular frequencies, thereby substantially reducing penetration of electromagnetic interference having the particular frequencies into the core of the inductor coil. Low frequency electromagnetic interference generated by a distant source may penetrate the conductor portions forming the coil, which are thin with respect to the frequency of the electromagnetic interference (i.e., thinner than the skin depth of the material for the frequency of the electromagnetic interference). However, the effect on the magnetic field may be insubstantial because equal and opposite magnetic fields are induced by the electromagnetic interference due to symmetry introduced by the shape of the inductor.

The itch of the coil forming inductor 800 may be limited by a particular integrated circuit manufacturing technology and may vary according thereto. Similarly, the space in between turns of inductor 800 (e.g., space 820) may vary according to the particular integrated circuit manufacturing technology. In general, decreases in space between the turns of inductor 800 reduce leakage of magnetic flux from the core of inductor 800, thereby reducing susceptibility of inductor 800 to external electromagnetic interference.

Individual turns of the coil forming inductor 800 include a top turn portion (e.g., top turn portion 812), a bottom turn portion (e.g., bottom turn portion 814), and sidewall turn portions (e.g., sidewall turn portions 816 and 818) coupling the top surface to the bottom surface. In at least one embodiment of the invention, inductor 800 is formed entirely in traditional integrated circuit layers, i.e., conductor and dielectric layer compositions having thicknesses which are typically encountered in traditional integrated circuit processes. For example, top turn portion 812 may be formed in the one or more top metal layers (e.g., metal-9) and bottom turn portion 814 may be formed in the one or more lowest metal layers (e.g., metal-1). The top and bottom turn portions may be patterned into solid conductor portions, if allowed by the particular integrated circuit manufacturing technology, or may be multiple metal lines coupled together to approximate solid conductor portions. Sidewall turn portions may be approximated by a plurality of conductive via structures formed in additional metal layers (e.g., metal-2-metal-8). In a typical integrated circuit process, metal layers are electrically coupled to adjacent metal layers (e.g., metal-2 is coupled to metal-3) by vias in a dielectric layer between the metal layers. Those vias are filled with conductive material.

Figure 8B:
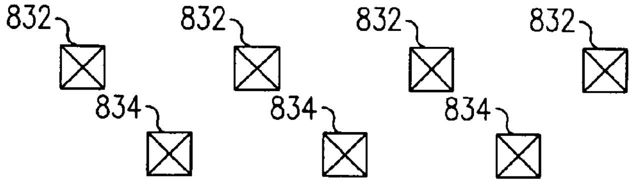
FIG. 8B illustrates a top-down view of via structures of a sidewall of the inductor of FIG. 8A consistent with at least one embodiment of the present invention.
Figure 8C:
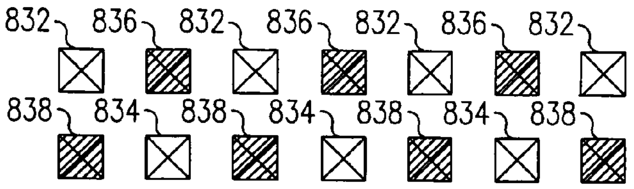
FIG. 8C illustrates a top-down view of via structures of a sidewall of the inductor of FIG. 8A consistent with at least one embodiment of the present invention.

Preferably, the vias are continuous, solid walls, but, discrete vias may be spaced a minimum distance apart and placed to form sidewalls of the coil. In an exemplary embodiment, additional rows of vias (e.g., vias 832 of FIG. 8B) are staggered from the first rows of vias (e.g., vias 834 of FIG. 8B) and are placed around the first set of vias, but in the same layer of vias to reduce the effective size of apertures formed between adjacent vias and to further attenuate any electromagnetic radiation of particular frequencies entering or leaving the core of the coil forming inductor 800. The vias in the typical integrated circuit process may be stacked on top of each other. However, vias in the typical integrated circuit layers may be formed without stacking adjacent vias, by staggering vias of adjacent layers from a location that would stack the vias. For example, vias formed in metal-2 (e.g., vias 836 and 838 of FIG. 8C) overlap the gaps formed by vias in metal-1 (e.g., vias 832 and 834 of FIG. 8C). Vias formed in alternating layers may be aligned, e.g., vias formed in metal-1 are aligned with vias formed in metal-3, and vias formed in metal-2 are aligned with vias formed in metal-4.

In at least one embodiment of the invention, the phase noise associated with a resonant circuit may be expressed as being proportional to the inductance of the resonant circuit:

$$PN \propto \frac{L}{Q_{RESONANT}}.$$

The phase noise associated with a resonant circuit may also be expressed as being inversely proportional to the capacitance of the resonant circuit:

$$PN \propto \frac{1}{CQ_{RESONANT}}.$$

To achieve a particular oscillating frequency, one technique for reducing the phase noise is to reduce $L/Q_L$. The power consumed by an exemplary resonant circuit is inversely proportional to the inductance and $Q_{RESONANT}$:

$$P \propto \frac{1}{LQ_{RESONANT}},$$

In applications where $Q_{RESONANT}$ is predominately affected by $Q_L$, $Q_{RESONANT}$ is effectively $Q_L$:

$$PN \propto \frac{L}{Q_L} \text{ and}$$

-continued $$P \propto \frac{1}{LQ_L}.$$

Thus, a power constraint associated with a particular design may be satisfied while reducing phase noise by keeping the product of L and $Q_L$ approximately constant while reducing $L/Q_L$.

One technique for reducing the inductance of the toroidal inductor is to reduce the cross-section of the core region of the coil. As the inductor cross-sectional area decreases by a factor of n, the resistance of the inductor decreases, but by a factor less than n, e.g., a reduction in the cross-sectional area by a factor of two may be matched by reductions in resistance of the coil by $\sqrt{2}$ and $Q_L$ of the inductor is reduced by $\sqrt{2}$. A reduction in inductor $Q_L$ increases phase noise of the resonant circuit because phase noise is inversely proportional to the $Q_L$ of the inductor. Techniques for reducing the inductance while maintaining the $Q_L$ associated with the inductor may provide an improved phase noise performance of the resonant circuit, which may be accomplished by maintaining the cross-sectional dimensions and increasing the length of a fractional-turn or single-turn solenoidal inductor, as shown in FIG. 5. Thus, in at least one embodiment of the invention, inductors having coils with cross-sections having larger ratios of area enclosed to perimeter are desirable for achieving a particular inductance when the width and height of the core are much greater than the thickness of the conductor from which the coil is formed. For example, a circular core cross-section may have improved performance over square core cross-sections, which have improved performance over rectangular cross-sections. However, when either the width or height of the coil is not much greater than the thickness of the conductor, other effects may become significant and performance may improve by increasing the other dimension although deviating from a circular or square cross-section. Forming an inductor in the traditional metal layers limits the cross-section of the coil forming the inductor, which may limit the resistance of the coil and the $Q_L$ of the inductor. In order to increase the cross-sectional area of inductor 800, in at least one embodiment of the invention, at least one of the top turn portions and the bottom turn portions of the inductor 800 are formed in redistribution layers, a package surrounding an integrated circuit, at least one conductor portion on a wafer backside, or any combination thereof.

Redistribution layers may be any layers formed on the integrated circuit used to route electrical connections between contact pads on an IC die and a location of a package contact. This may include depositing and patterning metal layers to transform an existing input/output layout into a pattern that satisfies the requirements of a solder bump design. The redistribution layers are typically formed above a passivation layer, i.e., a layer formed on an integrated circuit to provide electrical stability by protecting the integrated circuit from moisture, contamination particles, and mechanical damage. The passivation layer may include silicon dioxide, silicon nitride, polyimide, or other suitable passivation materials. Redistribution layers are typically formed above integrated circuit bonding pads. These pads, typically coupled to an electronic device formed in the integrated circuit, may include aluminum, copper, titanium, or other suitable material. However, redistribution layers may include additional dielectric and conductive layers formed on an integrated circuit die in the absence of a passivation layer or bonding pads.

Redistribution layers typically have thicknesses substantially greater than the thicknesses of typical dielectric and conductive layers formed on an integrated circuit die. For example, a typical conductive layer in an integrated circuit is less than 1 μm thick and corresponding dielectric layers are also less than 1 μm thick. However, conductive layers in an exemplary redistribution layer are at least 2 μm thick and corresponding dielectric layers are at least 5 μm thick. In another embodiment, the dielectric layers are at least 15 μm thick. Redistribution dielectric layers may include silicon nitride, oxynitride, silicon oxide, benzocyclobutene (BCB), polyimide, or other suitable materials. Redistribution conductive layers may include aluminum, copper, or other suitable materials.

The inductance of a toroidal inductor is approximately $$\frac{\mu N^2 A}{2\pi r},$$

where A is the cross-sectional area of the coil core, N is the number of turns forming the coil, and r is the toroid radius to the axis (FIG. 7). The inductance approximation is based on the magnetic field at the radius from the axis, but generally, the magnetic field varies within the coil core as a function of the radius from the axis. Techniques described herein may be used to implement inductors of various inductance values and associated quality factors for particular applications (e.g., inductances in the range of approximately 0.9 pH to 275 pH inclusively, having up to twenty turns, and associated quality factors in the range of 8 to 130 inclusively, at frequencies of oscillation in the range of 5 to 10 GHz or greater). Note that for an exemplary oscillator, improvements in $Q_L$ by a factor of 2 improve the phase noise by 3 dB and reductions in L by a factor of 2 improve phase noise by 3 dB. In at least one embodiment of the invention, such improvements may be achieved without substantially increasing power consumption of the oscillator circuit, as described above.

The inductance may be varied by varying the number of turns in the inductor coil. For example, referring back to FIG. 8A, inductor 800, designed in traditional integrated circuit layers, has 20 turns in a coil approximately 300 μm long, coil cross-sectional dimensions of approximately 9 μm high and approximately 10 μm wide, an inductance of approximately 275 picoHenries (pH) and an associated $Q_L$ of approximately 9 at 10 GHz. In another embodiment, inductor 800 has 20 turns in a coil approximately 1000 μm long, coil cross-sectional dimensions of approximately 9 μm high and approximately 40 μm wide, an inductance of approximately 500 pH, and an associated $Q_L$ of 13 at 5 GHz. In at least one embodiment of the invention, at least one turn of the 20 turn inductor is removed to include a capacitor coupled to the inductor. The number of turns removed to insert the capacitor depends upon the size of the capacitor array for a particular application.

Figure 9:
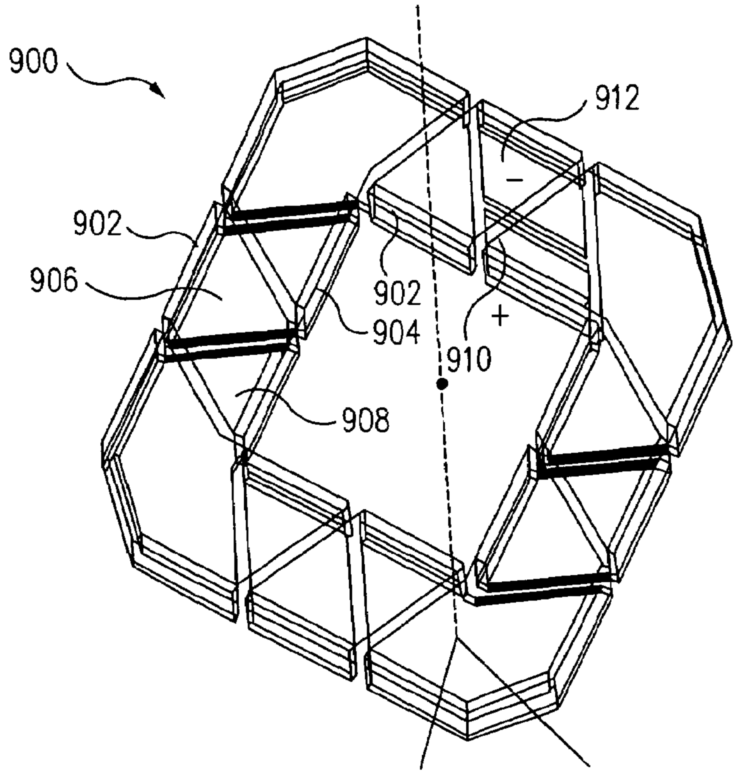
FIG. 9 illustrates a top-down, perspective view of an eight turn, self-shielding inductor consistent with at least one embodiment of the present invention.

Referring to FIG. 9, inductor 900, designed in traditional integrated circuit layers, has an inductance of approximately 128 pH and an associated $Q_L$ of approximately 13 at 10 GHz. The coil of inductor 900 has only eight turns is approximately 300 μm long, and has coil cross-sectional dimensions of approximately 9 μm high and 20 μm wide. A portion of an individual turn of inductor 900 includes top turn portion 906, bottom turn portion 908, and sidewall portions 902 and 904. An exemplary current flows through inductor 900 from positive terminal 910 to negative terminal 912, clockwise around the axis orthogonal to the page and intersecting center point 920.

Figure 10:
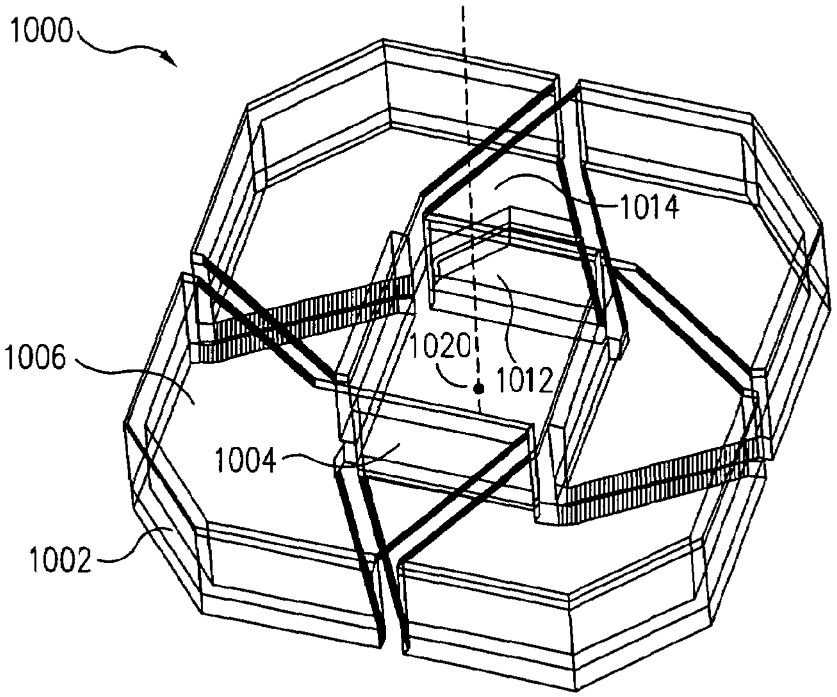
FIG. 10 illustrates a top-down, perspective view of a four turn, self-shielding inductor consistent with at least one embodiment of the present invention.

A coil of only four turns, designed in traditional integrated circuit layers, forms inductor 1000 (FIG. 10). When inductor 1000 has coil cross-sectional dimensions of approximately 9 μm high and approximately 20 μm wide, a coil of approximately 200 μm in length and an inductance of approximately 51 pH is achieved with an associated $Q_L$ of approximately 11 at 10 GHz. When the coil cross-sectional dimensions are approximately 20 μm high and approximately 20 μm wide, an inductance of approximately 75 pH is achieved with an associated $Q_L$ of approximately 14 at 10 GHz. A portion of an individual turn of inductor 1000 includes top turn portion 1006, bottom turn portion 1008, and sidewall portions 1002 and 1004. An exemplary current flows through inductor 1000 from positive terminal 1012 to negative terminal 1014, clockwise around the axis orthogonal to the page and intersecting center point 1020.

Figure 11A:
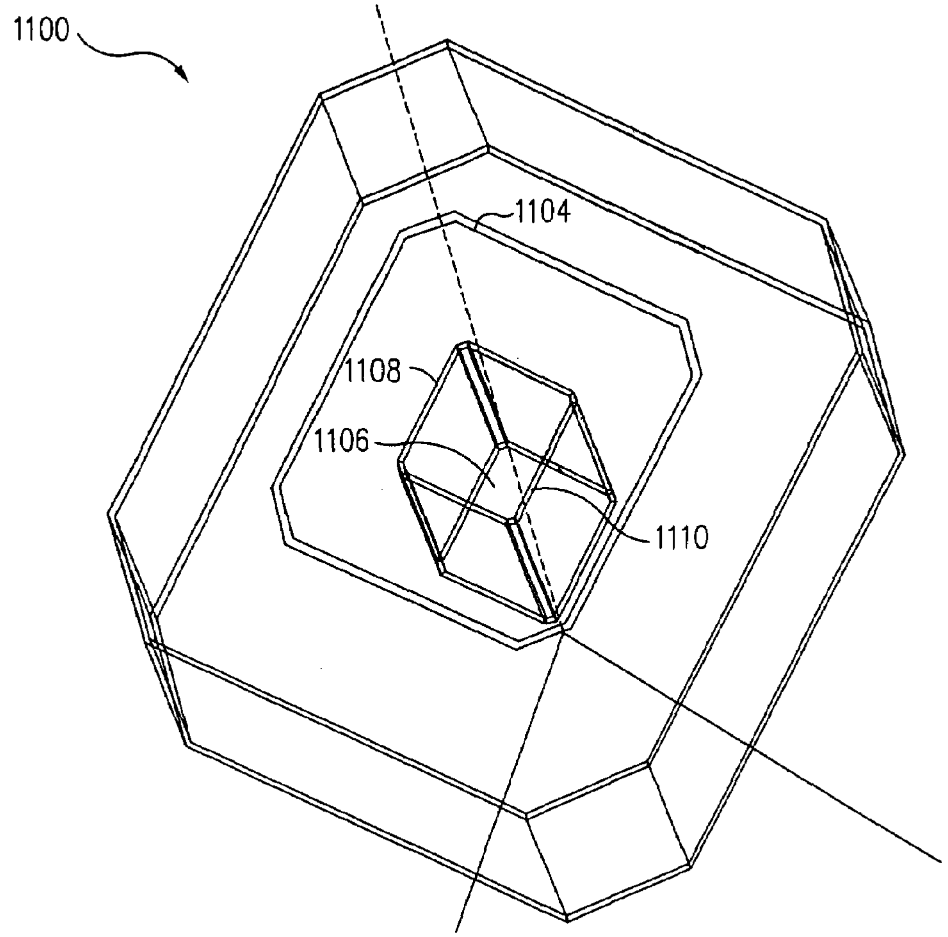
FIG. 11A illustrates a bottom-up, perspective view of a fractional-turn, self-shielding inductor consistent with at least one embodiment of the present invention.
Figure 11B:
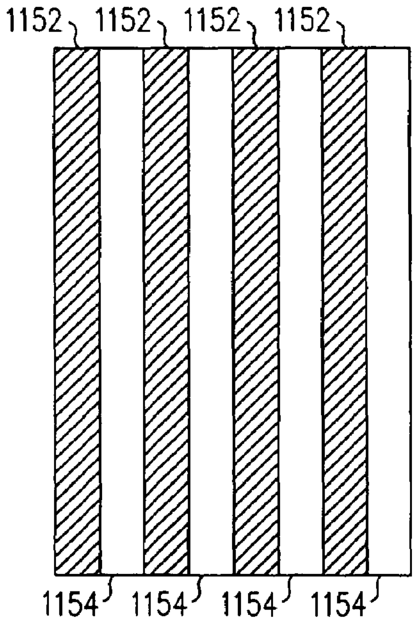
FIG. 11B illustrates a top-down view of an exemplary conductor portion consistent with at least one embodiment of the present invention.
Figure 12:
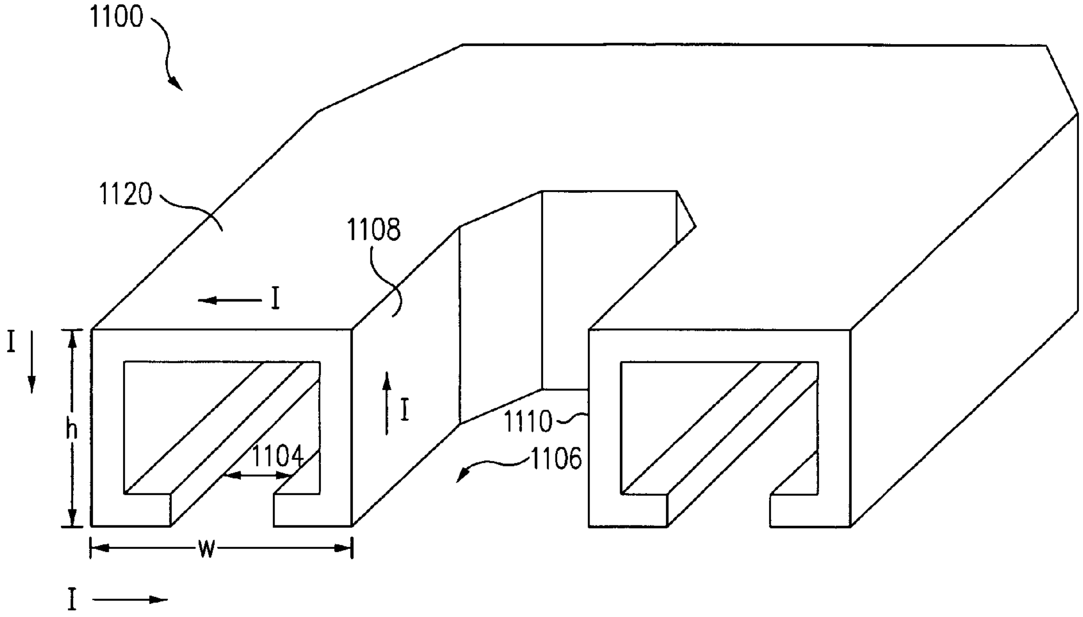
FIG. 12 illustrates a cross-sectional, perspective view of a fractional-turn, self-shielding inductor consistent with at least one embodiment of the present invention, the cross sectional plane being parallel to an axis of the self-shielding inductor.
Figure 13A:
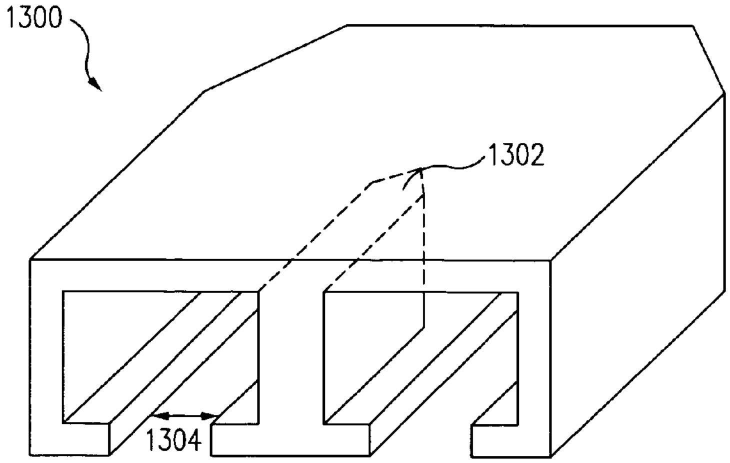
FIG. 13A illustrates a cross-sectional, perspective view of a fractional-turn, self-shielding inductor consistent with at least one embodiment of the present invention, the cross sectional plane being parallel to an axis of the self-shielding inductor.
Figure 13B:
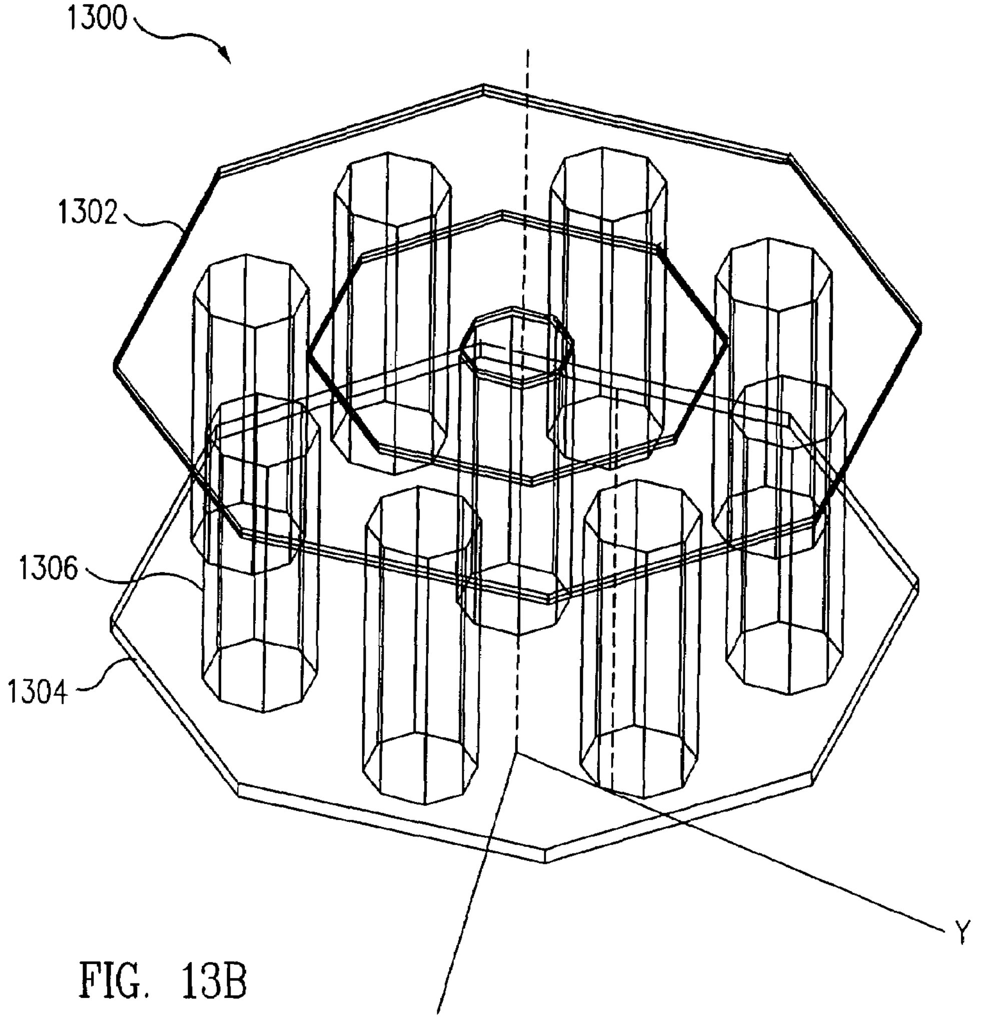
FIG. 13B illustrates a bottom-up, perspective view of a fractional-turn, self-shielding inductor consistent with at least one embodiment of the present invention.
Figure 13C:
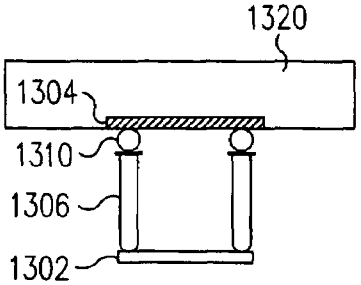
FIG. 13C illustrates a cross-sectional view of a fractional-turn, self-shielding inductor consistent with at least one embodiment of the present invention.

Referring to FIGS. 11-13, in at least one embodiment of the invention, the number of turns is reduced to less than one complete turn. At least one portion of inductor 1100 may be formed in a traditional integrated circuit layer, a redistribution layer, a package surrounding an integrated circuit, a through-substrate via, a conductor portion on a wafer backside, or any combination thereof. In at least one embodiment of the invention, inductor 1100 is designed in traditional integrated circuit layers of an exemplary integrated circuit manufacturing technology. Inductor 1100 has an inductance of approximately 0.9 pH and an associated $Q_L$ of approximately 8 at 10 GHz. The coil is approximately 150 μm long and coil cross-sectional dimensions are approximately 9 μm high and 10 μm wide.

In at least one embodiment of the invention, the top conductor portions of inductor 1100 are formed in redistribution layers. Decreases in the center region of the inductor, e.g., region 1106, may increase the cross-sectional area of the coil and the length of the coil. An exemplary inductor 1100 has an inductance of approximately 8 pH and an associated $Q_L$ of approximately 56 at 10 GHz. The coil is approximately 750 μm long, coil cross-sectional dimensions are approximately 120 μm wide and 30 μm high, and center region 1106 has a length of approximately 66 μm and a width of approximately 66 μm. In another embodiment, an exemplary inductor 1100 has an inductance of approximately 29 pH and an associated $Q_L$ of approximately 133 at 10 GHz. The coil is approximately 750 μm long, cross-sectional dimensions are approximately 120 μm wide and 100 μm high, and center region 1106 has a length of approximately 66 μm and a width of approximately 66 μm.

In at least one embodiment of the invention, the top conductor portions are formed in at least one package layer. An exemplary inductor 1100 has an inductance of approximately 40 pH and an associated $Q_L$ of approximately 79 at 10 GHz. The coil is approximately 500 μm long, coil cross-sectional dimensions are approximately 100 μm wide and 100 μm high, and a center region has a length of approximately 26 μm and a width of approximately 26 μm. In another embodiment, an exemplary inductor 1100 has an inductance of approximately 26 pH and an associated $Q_L$ of approximately 126 at 10 GHz. The coil is approximately 750 μm long, coil cross-sectional dimensions are approximately 100 μm wide and 100 μm high, and center region 1106 has a length of approximately 66 μm and a width of approximately 66 μm. In at least one embodiment of the invention, the thickness of a bottom conductor portions is increased (e.g., by forming the bottom conductor portions from metal-1 and metal-2, rather than from just metal-1) to improve the $Q_L$ at certain frequencies, which also makes the inductor less susceptible to electromagnetic interference penetrating the bottom conductor portion into the core region of the coil.

Preferably, top conductor portions and bottom conductor portions are continuous solid metal portions. However, top and/or bottom conductor portions may be formed from a plurality of conductive lines or slotted top and/or bottom conductor portions. In an exemplary embodiment, conductive lines formed in a first metal layer (e.g., metal lines 1152 of FIG. 11B formed in metal-1) are coupled to and staggered from conductive lines formed in a second metal layer (e.g., metal lines 1154 of FIG. 11B formed in metal-2) forming an individual top or bottom conductor portion.

A portion of inductor 1000 includes top turn portion 1120, bottom turn portions 1122 and 1124, and sidewall portions 1108 and 1128. An exemplary current flows through inductor 1000 from bottom turn portion 1124 to inner sidewall portion 1108 to top portion 1120 to outer sidewall portion 1128 to bottom turn portion 1122. In at least one embodiment of the invention, the coil of inductor 1100 is formed around an axis such that inner sidewall 1108 and inner sidewall 1110 of inductor 1100 are a negligible distance from the axis and sidewalls 1108 and 1110 form a single inner sidewall structure (e.g., structure 1302 of inductor 1300 in FIG. 13A). Structure 1302 may be a single column of individual vias, a single conductive sheet, or other suitable structure.

Referring to FIG. 13B, an exemplary fractional-turn inductor includes turn portions forming an octagonal shape centered around an axis orthogonal to a surface of an integrated circuit. Bottom turn portion 1302 is formed by one or more traditional integrated circuit layers (e.g., metal-8 and metal-9). Sidewalls of inductor 1300 are approximated by columns of vias (e.g., via column 1306). In at least one embodiment of the invention, top turn portion 1304 is formed in at least one redistribution layer. Top turn portion 1304 may be formed in a 3 μm redistribution layer which is spaced 5 μm-15 μm above bottom turn portion 1302. In at least one embodiment of the invention, top turn portion 1304 is formed in a package (e.g., package 1320) and is coupled to via column 1306 by a conductive bump (e.g., conductive bump 1310).

Figure 14:
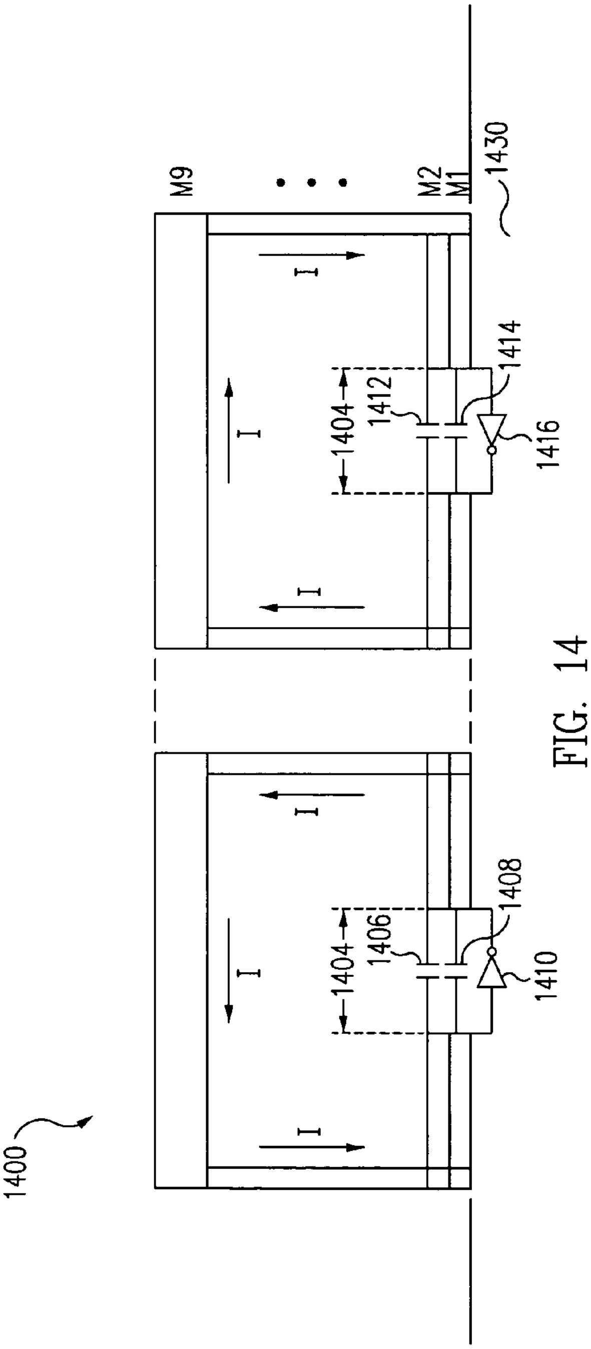
FIG. 14 illustrates a cross-sectional view of a portion of a fractional-turn, self-shielding inductor consistent with at least one embodiment of the present invention, the cross sectional plane being parallel to an axis of the self-shielding inductor.

A gap in the conductor portions forming the coil of an exemplary inductor (e.g., gap 1104 of inductor 1100 or gap 1304 of inductor 1300) is included for establishing current in the inductor, for example, by coupling the inductor to an associated integrated circuit. Referring to FIG. 14, one or more capacitors (e.g., capacitors 1406, 1408, 1412, and 1414) and one or more amplifiers (e.g., amplifiers 1410 and 1416) are coupled in parallel to inductor 1400 and gap 1404 is provided to accommodate such structures coupled to inductor 1400. In at least one embodiment of the invention the gap has an approximately constant width and is symmetric around the inductor axis (i.e., the axis orthogonal to the surface of the integrated circuit) to facilitate contacts with structures distributed around the inductor axis. Distribution of structures and contacts around the axis reduces restrictions on current flow (e.g., current crowding) between inductor 1100 and the structures coupled to inductor 1100. Capacitors 1408 and 1414 may be transistor capacitors and may be formed in the active area of the integrated circuit along with amplifiers 1410 and 1416.

Figure 15:
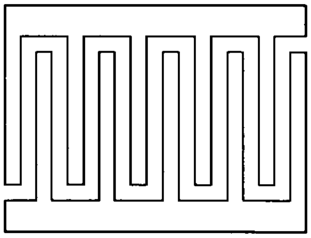
FIG. 15 illustrates a top-down view of a capacitor structure consistent with at least one embodiment of the invention.

In at least one embodiment of the invention, capacitors 1406, 1408, 1412, and 1414 are integrated circuit capacitors, i.e., “finger” capacitors (FIG. 15), formed by a plurality of densely-spaced, substantially parallel metal lines, i.e., “fingers.” Alternating ones of the fingers are coupled to form the plates of the capacitor. The bottom conductor portions of inductor 1400 may be formed in both a first conductive layer on the integrated circuit substrate (e.g., metal-1) and at least a second conductive layer on the integrated circuit substrate (e.g., metal-2). Capacitors 1408 and 1414 may be formed in metal-1 and capacitors 1406 and 1412 may be formed in metal-2. However, a capacitor or other integrated circuit element coupled to the inductor may be formed in any combination of conductive layers on the integrated circuit and coupled by conductive vias to any suitable portion of inductor 1400 to provide any suitable current path.

Figure 16:
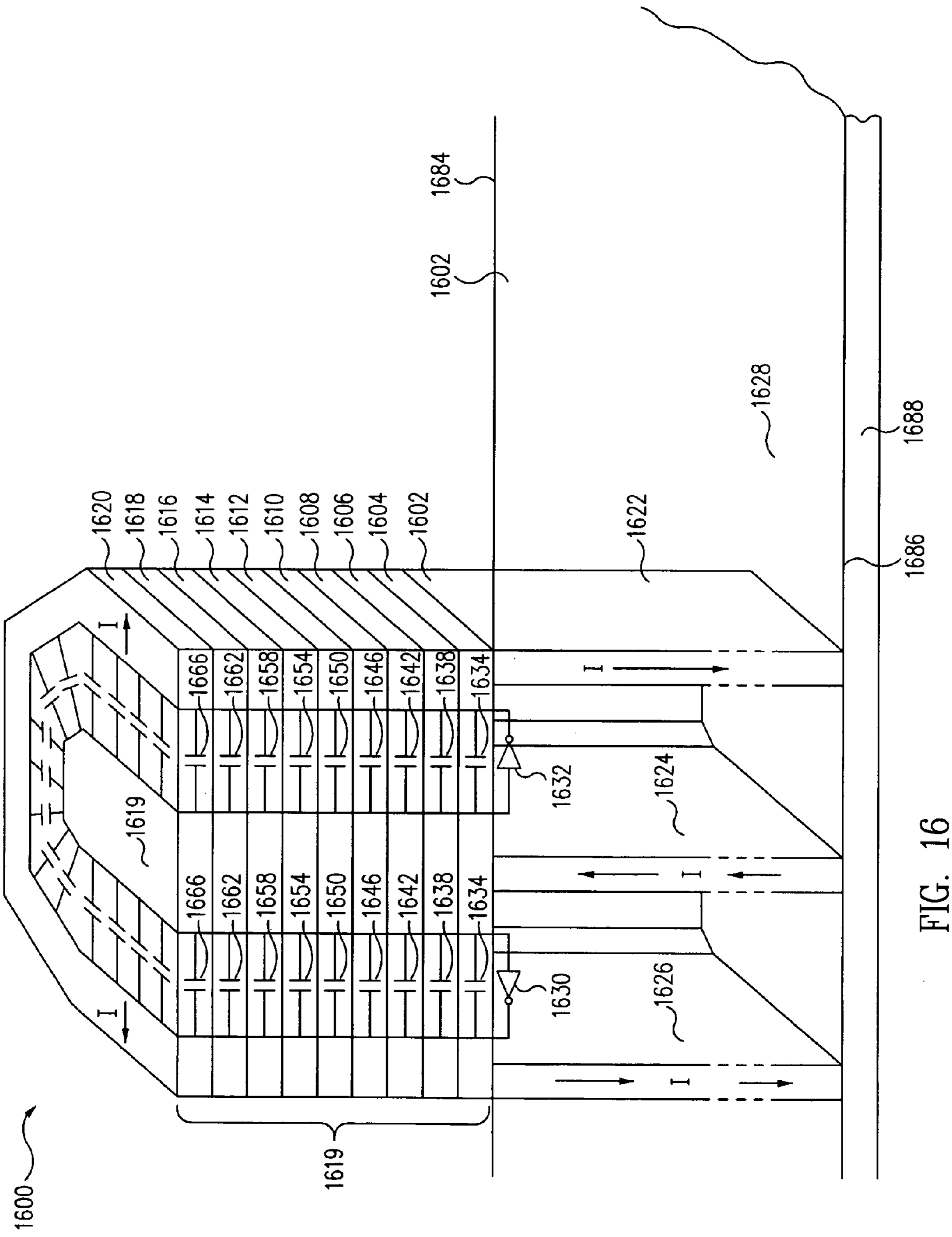
FIG. 16 illustrates a cross-sectional, perspective view of a fractional-turn, self-shielding inductor including at least one through-substrate structure consistent with at least one embodiment of the present invention, the cross sectional plane being parallel to an axis of the self-shielding inductor.

Referring to FIG. 16, in at least one embodiment of the invention, the top turn portions and the bottom turn portions of an inductor (e.g., inductor 1600) are at least partially formed by a conductor portion on a wafer backside to increase the cross-sectional area of an inductor. At least a portion of sidewalls (e.g., sidewalls 1622, 1624 and 1626) of inductor 1600 are formed by through-substrate interconnect. Exemplary through-substrate interconnect is formed in trenches or vias that extend from a frontside of a substrate (e.g, frontside 1684) to a backside of the substrate (e.g., backside 1686). Through-substrate trenches or vias may be formed by KOH etching, deep reactive-ion etching, electrochemical etching, or other suitable technique for forming trenches or vias through a substrate (e.g., a silicon substrate, a silicon-on-insulator substrate, a GaAs substrate, or other substrate suitable for integrated circuit processing). Exemplary through-substrate vias and trenches may be convex (i.e., having a smaller width in the middle of the trench or via than at points closer to the substrate frontside or substrate backside). The height of through-substrate trenches or vias depends upon the substrate thickness and in one exemplary process may have a height in the range including approximately 200 μm and approximately 750 μm for a standard semiconductor substrate.

The through-substrate vias or trenches may be coated with a thin lining of conducting material on the inside surface, may be filled with highly doped polysilicon, may be coated with an insulator liner and filled with a solid conducting core, or may be formed by other suitable techniques and/or materials for forming through-substrate vias or trenches. An insulating liner may be a silicon nitride layer deposited by plasma-enhanced chemical vapor deposition or other suitable technique on the inside surface of the vias or trenches. Silicon nitride may also be formed on the frontside and the backside of the substrate. The conducting material may include copper, silver, gold, aluminum, or other conducting material and may be formed by electroplating a Ta—Ti—Cu seed, or other suitable techniques. Both the seed and the conducting material may be formed on the substrate backside (e.g., conducting material 1688) in addition to being formed within a trench or via. A perforated seed may be formed on the substrate backside, which grows horizontally on the backside to seal the via or trench opening. This technique may be followed by deposits of conducting material from the frontside of the substrate to fill the via or trench. After forming the through-substrate interconnect, the frontside and/or backside of the substrate may be chemical-mechanical polished (i.e., chemical-mechanical planarized). In at least one embodiment of the invention, an additional conducting layer including copper, silver, gold, aluminum, or other suitable conductor may then be formed the backside of the substrate (e.g., conducting layer 1688).

In at least one embodiment of the invention, top turn portions 1619 may be formed in at least one traditional integrated circuit conductive layer (e.g., conductive layers 1604, 1606, . . . 1620, which may correspond to metal-1, metal-2, . . . metal-9 in an exemplary integrated circuit process and are coupled together), at least one redistribution layer, or at least one package layer, or combinations thereof. A gap in top turn portions 1619 is included for coupling inductor 1600 to an associated integrated circuit. For example, inductor 1600 is coupled to amplifiers 1630 and 1632 formed in an active area of the substrate (i.e., active area 1602). In addition, inductor 1600 may be coupled to vertically stacked capacitors 1634, 1638, 1642, . . . 1666, which may be finger capacitors, as described above. Vertically stacked capacitors 1634, 1638, 1642, . . . 1666 may be formed in corresponding integrated circuit conductive layers 1604, 1606, 1608, . . . , 1620. In at least one embodiment of the invention, capacitors 1634, 1638, 1642, . . . 1666 and amplifiers 1634 are distributed around the axis of inductor 1600 (i.e., the axis orthogonal to the surface of the substrate). The top conductor portions may be formed in the same number of conductive layers as the capacitors. However, note that such a technique may reduce the cross-section of the coil, which may be significant to some designs (e.g., inductors formed entirely in the traditional integrated circuit layers). For example, the number of conductive layers used to form the top conductor portions determines the thickness of the top conductor portions and will affect the $Q_L$ of the inductor at the particular frequency of oscillation for an oscillator including the inductor.

Figure 17:
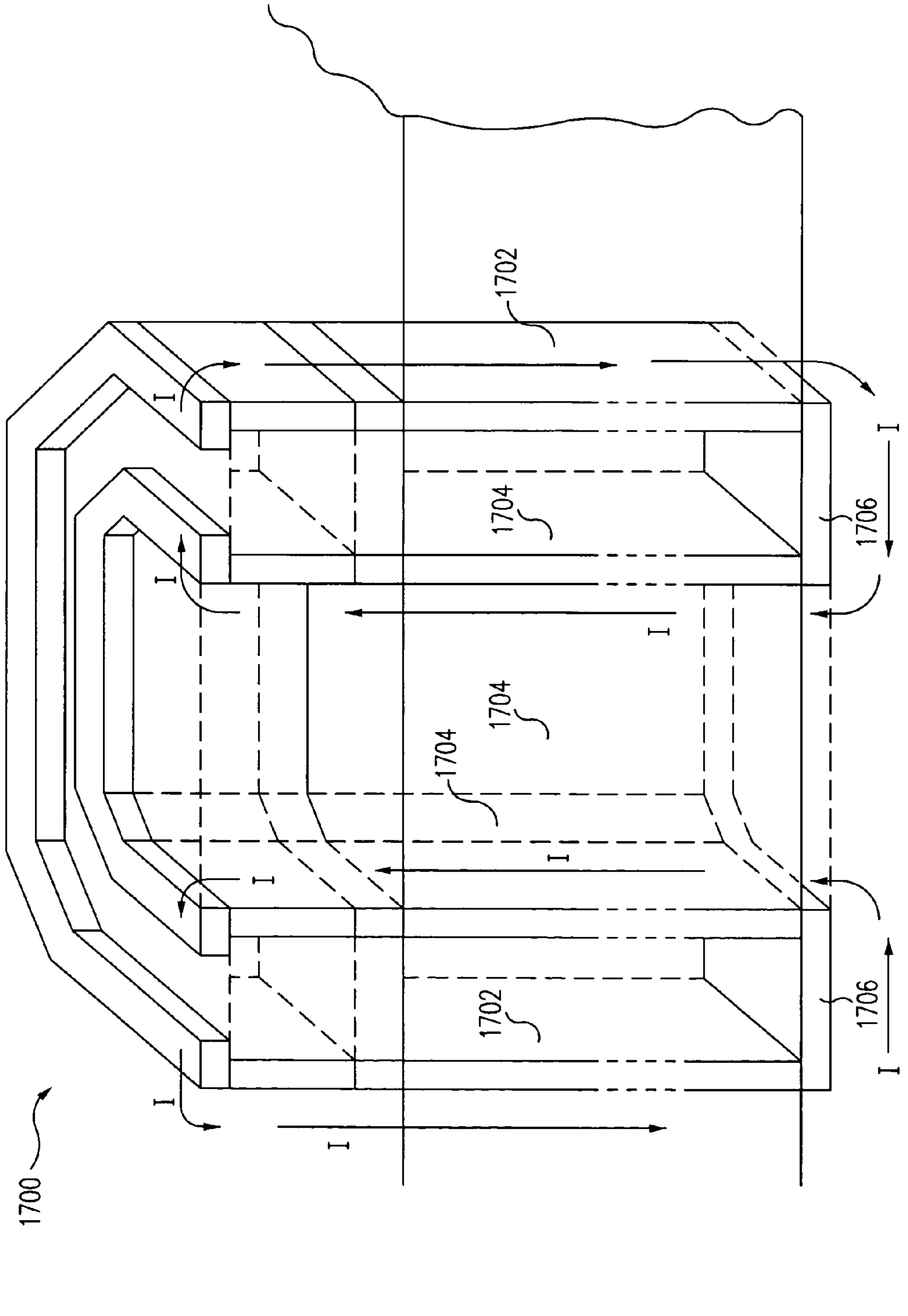
FIG. 17 illustrates a cross-sectional, perspective view of a fractional-turn, self-shielding inductor including at least one through-substrate structure consistent with at least one embodiment of the present invention, the cross sectional plane being parallel to an axis of the self-shielding inductor.

Referring to FIG. 17, in at least one embodiment of the invention, inner sidewalls of an inductor formed by through-substrate interconnect are formed a substantial distance from the axis of the inductor and form distinct sidewall structures that enclose a substantial center region of the inductor. For example, sidewalls 1704 of inductor 1700 are formed by through-substrate interconnect by techniques described above, and the bottom turn portions of inductor 1700 are formed by backside conductors 1706. Inductors having additional turns may be implemented by through-substrate interconnect techniques and by patterning conductors on the substrate backside to form turns of the inductor.

While circuits and physical structures are generally presumed, it is well recognized that in modern semiconductor design and fabrication, physical structures and circuits may be embodied in computer readable descriptive form suitable for use in subsequent design, test, or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The description of the invention set forth herein is illustrative, and is not intended to limit the scope of the invention as set forth in the following claims. For example, while the invention has been described in at least one embodiment in which the self-shielding inductor is included in an oscillator circuit, one of skill in the art will appreciate that the teachings herein can be utilized for other integrated circuit applications including an inductor. Variations and modifications of the embodiments disclosed herein, may be made based on the description set forth herein, without departing from the scope and spirit of the invention as set forth in the following claims.

What is claimed is:

1. An apparatus comprising:

a self-shielding inductor forming at least a portion of an oscillator circuit, the self-shielding inductor including a coil of coupled conductor portions, the coil being formed around an axis and the coupled conductor portions substantially enclosing a core region within the coil, wherein the axis is coplanar with cross-sections of the coil and is external to cross-sections of the coil, wherein less than approximately one complete turn forms the coil.

2. The apparatus, as recited in claim 1, further comprising:

an integrated circuit that includes at least a portion of the self-shielding inductor, an amplifier coupled to the self-shielding inductor, and a capacitor coupled to the self-shielding inductor, wherein the self-shielding inductor, the amplifier, and the capacitor form at least a portion of the oscillator circuit.

3. The apparatus, as recited in claim 1, wherein the coil forms a perimeter of a substantially symmetric polygonal center of the self-shielding inductor.

4. The apparatus, as recited in claim 1, wherein the coil comprises:

first, second, third, and fourth portions, wherein the first portion of the coil is parallel to the second portion of the coil, the first and second portions of the coil being approximately equidistant from the axis, and the first and second portions of the coil being coupled to conduct substantially equal currents in substantially opposite directions, and wherein the third portion of the coil is parallel to the fourth portion of the coil, the third and fourth portions of the coil being approximately equidistant from the axis, and the third and fourth portions of the coil being coupled to conduct substantially equal currents in substantially opposite directions.

5. The apparatus, as recited in claim 1, wherein substantially equal and substantially opposite magnetic fields are generated parallel to a first plane intersecting the axis in corresponding portions of the core region in response to a current flowing though corresponding coupled conductor portions and substantially equal and substantially opposite magnetic fields are generated parallel to at least a second plane intersecting the axis in corresponding portions of the core region in response to a current flowing though corresponding coupled conductor portions.

6. The apparatus, as recited in claim 1, wherein the self-shielding inductor is formed at least partially on the backside of an integrated circuit substrate.

7. The apparatus, as recited in claim 1, wherein the self-shielding inductor is formed at least partially in a redistribution layer.

8. The apparatus, as recited in claim 1, wherein the self-shielding inductor has an associated quality factor in a range of approximately 8 to approximately 130 at approximately 5 GHz or greater, inclusively.

9. The apparatus, as recited in claim 1, wherein a number of turns forming the coil is in a range from one turn to approximately twenty turns, inclusively.

10. The apparatus, as recited in claim 1, wherein the oscillator circuit includes a capacitance coupled in parallel with the self-shielding inductor, the capacitance being formed to provide a current path having a current distribution effectively the same as the coupled conductor portions.

11. The apparatus, as recited in claim 1, wherein the oscillator circuit includes an amplifier coupled in parallel with the self-shielding inductor, the amplifier being formed to provide a current path having a current distribution effectively the same as the coupled conductor portions.

12. The apparatus, as recited in claim 1, wherein the coil includes up to a single turn and a current path of the turn is formed in the approximate center of the self-shielding inductor.

13. The apparatus, as recited in claim 1, wherein inner sidewalls of the self-shielding inductor are formed by at least a column of stacked via structures.

14. The apparatus, as recited in claim 1, wherein the self-shielding inductor is formed entirely within an integrated circuit.

15. The apparatus, as recited in claim 1, wherein at least a portion of the self-shielding inductor is formed in at least one redistribution layer.

16. The apparatus, as recited in claim 1, wherein at least a portion of the self-shielding inductor is formed in at least one layer of a package surrounding an integrated circuit.

17. The apparatus, as recited in claim 1, wherein the core region includes at least predominately, substantially non-magnetic layers.

18. The apparatus, as recited in claim 1, wherein the core region includes at least predominately dielectric material.

19. The apparatus, as recited in claim 1, wherein the coupled conductor portions of the coil include at least a first sidewall conductor portion, a second sidewall conductor portion, and a top conductor portion coupling the first and second sidewall conductor portions, at least one of the first and second sidewalls being formed at least in part by discrete via structures in an integrated circuit.

20. The apparatus, as recited in claim 19, wherein the discrete via structures are staggered.

21. The apparatus, as recited in claim 19, wherein the discrete via structures include a thru-substrate via.

22. The apparatus, as recited in claim 1, wherein the coupled conductor portions of the coil include at least a first sidewall conductor portion, a second sidewall conductor portion, and a top conductor portion coupling the first and second sidewall conductor portions, and wherein at least one of the first and second sidewall conductor portions are formed at least in part by discrete via structures in an integrated circuit and at least one of the top conductor portion and a bottom conductor portion is formed at least in part by a plurality of conductive lines, at least one of the plurality of conductive lines being formed in a first metal layer and at least one of the plurality of metal lines being formed in a second metal layer, the conductive lines in the first metal layer being coupled to and staggered from the conductive lines in the second metal layer.

23. The apparatus, as recited in claim 19, wherein at least one of the top conductor portion and a bottom conductor portion is formed by a substantially solid conductive layer.

24. An apparatus comprising:

a self-shielding inductor forming at least a portion of an oscillator circuit, the self-shielding inductor including a coil of coupled conductor portions, the coil being formed around an axis and the coupled conductor portions substantially enclosing a core region within the coil, wherein the axis is coplanar with cross-sections of the coil and is external to cross-sections of the coil, wherein inner sidewalls of the self-shielding inductor are formed in the approximate center of the self-shielding inductor.

25. The apparatus, as recited in claim 24, wherein less than approximately one complete turn forms the coil.

26. An apparatus comprising:

a first node on an integrated circuit die;

a second node on the integrated circuit die;

a capacitor coupling the first node to the second node;

an amplifier coupled between the first node and the second node; and means for generating a magnetic field in response to a current flowing between the first node and the second node, wherein the means for generating confines the magnetic field to a substantially enclosed region of the generating means, wherein the means for generating comprises a coil having less than approximately one complete turn.

* * * * *